United States Patent
Matsushita et al.

(10) Patent No.: US 9,768,265 B1
(45) Date of Patent: Sep. 19, 2017

(54) SEMICONDUCTOR MEMORY DEVICE

(71) Applicant: TOSHIBA MEMORY CORPORATION, Minato-ku (JP)

(72) Inventors: Daisuke Matsushita, Yokkaichi (JP); Yasushi Nakasaki, Yokohama (JP); Tsunehiro Ino, Fujisawa (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 15/266,588

(22) Filed: Sep. 15, 2016

(30) Foreign Application Priority Data

Mar. 17, 2016 (JP) ................. 2016-053418

(51) Int. Cl.
| | |
|---|---|
| *H01L 27/108* | (2006.01) |
| *H01L 29/792* | (2006.01) |
| *H01L 21/31* | (2006.01) |
| *H01L 29/423* | (2006.01) |
| *H01L 27/11556* | (2017.01) |
| *H01L 29/51* | (2006.01) |

(52) U.S. Cl.
CPC .. *H01L 29/42332* (2013.01); *H01L 27/11556* (2013.01); *H01L 29/517* (2013.01); *H01L 29/518* (2013.01)

(58) Field of Classification Search
CPC ............. H01L 27/11517; H01L 29/788; H01L 29/42324; H01L 29/66825; H01L 29/6684; H01L 29/78391
See application file for complete search history.

(56) References Cited

U.S. PATENT DOCUMENTS

| | | | | |
|---|---|---|---|---|
| 7,759,715 B2* | 7/2010 | Bhattacharyya | ....... | B82Y 10/00 257/296 |
| 8,013,380 B2 | 9/2011 | Nakasaki et al. | | |

(Continued)

FOREIGN PATENT DOCUMENTS

| | | |
|---|---|---|
| JP | 2006-324351 A | 11/2006 |
| JP | 2008-91421 A | 4/2008 |

(Continued)

OTHER PUBLICATIONS

Atsushi Toki, et al., "ESR and PL Study of Charge Trapping Centers in Silicon Nitride Films and Its Verification with Novel ONO-Sidewall 2-bit/cell Nonvalatile Memory" International Conference on Solid State Device and Materials, Sep. 19-21, 2007, pp. 318-319.

Jung Ho Yoon, et. al., "Highly Uniform, Electroforming-Free, and Self-Rectifying Resistive Memory in the $Pt/Ta_2O_5/HfO_{2-x}/TiN$ Structure" Advanced Functional Materials, vol. 24, 2014, pp. 5086-5095.

(Continued)

*Primary Examiner* — Benjamin Sandvik
*Assistant Examiner* — Damon Hillman
(74) *Attorney, Agent, or Firm* — Oblon, McClelland, Maier & Neustadt, L.L.P.

(57) ABSTRACT

According to one embodiment, a semiconductor memory device includes a semiconductor layer, a first electrode, first and second oxide layers, and a storage layer. The first oxide layer is provided between the semiconductor layer and the first electrode. The second oxide layer is provided between the first oxide layer and the first electrode. The storage layer is provided between the first and second oxide layers. The storage layer includes a first region including silicon nitride, a second region provided between the first region and the second oxide layer and including silicon nitride, and a third region provided between the first and second regions. The third region includes a plurality of first metal atoms. A first density of bond of the first metal atoms in the third region is lower than a second density of bond of the first metal atom and a nitrogen atom in the third region.

17 Claims, 4 Drawing Sheets

(56) References Cited

U.S. PATENT DOCUMENTS

| | | | |
|---|---|---|---|
| 8,211,811 B2* | 7/2012 | Matsushita | H01L 21/28282 257/324 |
| 8,390,054 B2* | 3/2013 | Ino | B82Y 10/00 257/315 |
| 8,587,050 B2* | 11/2013 | Ohba | B82Y 10/00 257/315 |
| 8,698,313 B2 | 4/2014 | Hirano et al. | |
| 2003/0132432 A1* | 7/2003 | Yoshii | B82Y 10/00 257/17 |
| 2008/0217680 A1 | 9/2008 | Shimizu et al. | |
| 2009/0236595 A1* | 9/2009 | Atanackovic | H01L 27/1207 257/43 |
| 2011/0233655 A1 | 9/2011 | Shimizu et al. | |
| 2013/0240977 A1 | 9/2013 | Kaneoka et al. | |
| 2015/0179819 A1 | 6/2015 | Kim et al. | |
| 2017/0077115 A1 | 3/2017 | Ino et al. | |

FOREIGN PATENT DOCUMENTS

| | | |
|---|---|---|
| JP | 2009-81203 A | 4/2009 |
| JP | 2009-212321 A | 9/2009 |
| JP | WO 2011/055433 A1 | 5/2011 |
| JP | 2011-205046 A | 10/2011 |
| JP | 2013-191666 A | 9/2013 |
| JP | 2017-54985 A | 3/2017 |
| WO | WO 2006/095890 A | 9/2006 |

OTHER PUBLICATIONS

Hiroshi Sunamura, et. al., "Suppression of Lateral Charge Redistribution Using Advanced Impurity Trap Memory for Improving High Temperature Retention" Electron Devices Meeting, 2006. IEDM '06. International, 4 Pages.

* cited by examiner

SEMICONDUCTOR MEMORY DEVICE

CROSS-REFERENCE TO RELATED APPLICATIONS

This application is based upon and claims the benefit of priority from Japanese Patent Application No. 2016-053418, filed on Mar. 17, 2016; the entire contents of which are incorporated herein by reference.

FIELD

Embodiments described herein relate generally to a semiconductor memory device.

BACKGROUND

It is desired that a storage density of a semiconductor memory device is improved.

DETAILED DESCRIPTION

Figure 1A:
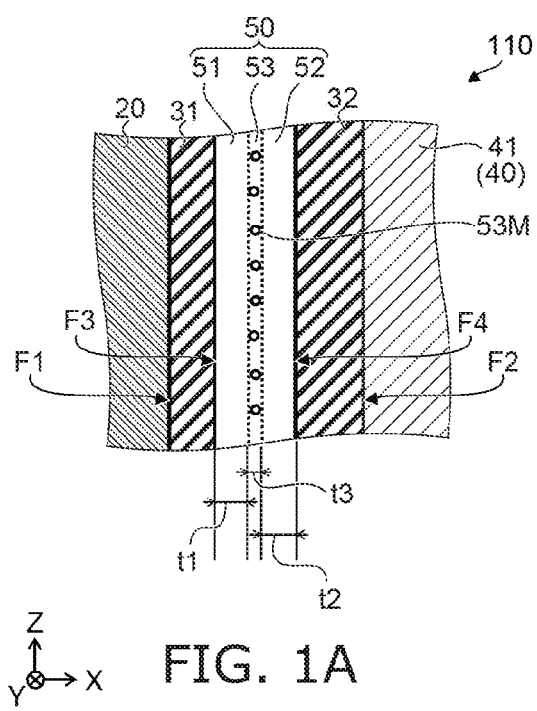
FIG. 1A and FIG. 1B are schematic views illustrating a semiconductor memory device according to a first embodiment.

According to one embodiment, a semiconductor memory device includes a semiconductor layer, a first electrode, a first oxide layer, a second oxide layer, and a storage layer. The first oxide layer is provided between the semiconductor layer and the first electrode. The second oxide layer is provided between the first oxide layer and the first electrode. The storage layer is provided between the first oxide layer and the second oxide layer. The storage layer includes a first region including silicon nitride, a second region provided between the first region and the second oxide layer and including silicon nitride, and a third region provided between the first region and the second region. The third region includes a plurality of first metal atoms. A first density of bond of the first metal atoms in the third region is lower than a second density of bond of the first metal atom and a nitrogen atom in the third region.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the present specification and drawings, the same elements as those described previously with reference to earlier figures are labeled with like reference numerals, and the detailed description thereof is omitted as appropriate.

First Embodiment

Figure 1B:
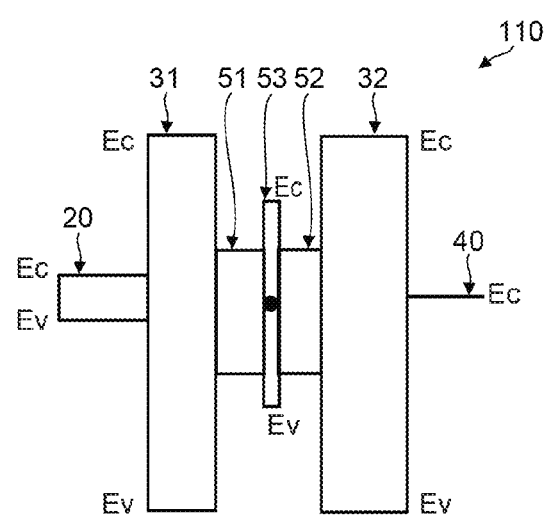

FIG. 1A and FIG. 1B are schematic views illustrating a semiconductor memory device according to a first embodiment.

FIG. 1A is a cross-sectional view. FIG. 1B is an energy band diagram and illustrates a conduction band end Ec and a valence band end Ev.

As shown in FIG. 1A, a semiconductor memory device 110 according to the embodiment is configured to include a semiconductor layer 20, a first electrode 41 (electrode 40), a first oxide layer 31, a second oxide layer 32, and a storage layer 50. The first oxide layer 31 is provided between the semiconductor layer 20 and the first electrode 41 to include an oxide. The second oxide layer 32 is provided between the first oxide layer 31 and the first electrode 41 to include an oxide. The storage layer 50 is provided between the first oxide layer 31 and the second oxide layer 32.

In the semiconductor memory device 110, a region where the semiconductor layer 20 and the first electrode 41 intersect each other becomes one memory unit. A stacked film including the first oxide layer 31, the second oxide layer 32, and the storage layer 50 is provided to the memory unit.

A direction from the semiconductor layer 20 toward the first electrode 41 is defined as a first direction. In the example of FIG. 1A, the first direction is an X-axis direction. One direction perpendicular to the X-axis direction is defined as a Z-axis direction. A direction perpendicular to the X-axis direction and the Z-axis direction is defined as a Y-axis direction.

As described below, the semiconductor layer 20 may have a pillar shape. For example, the semiconductor layer 20 may extend along the second direction. The second direction intersects the first direction (in the example of FIG. 1A, the X-axis direction). In the example, the second direction is the Z-axis direction. In addition, the first electrode 41 may be provided around the semiconductor layer 20.

The storage layer 50 is configured to include a first region 51, a second region 52, and a third region 53. The first region 51 includes a silicon nitride. The second region 52 is provided between the first region 51 and the second oxide layer 32 to include a silicon nitride. The third region 53 is provided between the first region 51 and the second region 52. The third region 53 includes a plurality of first metal atoms 53M.

The first oxide layer 31 functions as, for example, a tunnel insulating layer. The second oxide layer 32 functions as, for example, a block insulating layer. The storage layer 50 functions as, for example, a charge storage film.

As shown in FIG. 1B, for example, the energy of the conduction band end Ec of the first oxide layer 31 is higher than the energy of the conduction band end Ec of the semiconductor layer 20. The first oxide layer 31 includes, for example, an insulating material. For example, the energy of the conduction band end Ec of the second oxide layer 32 is higher than the energy of the conduction band end Ec of the semiconductor layer 20. The second oxide layer 32 includes, for example, an insulating material. For example, the energy of the conduction band end Ec in the storage layer 50 is lower than the energy of the conduction band end Ec of the first oxide layer 31 and is lower than the energy of the conduction band end Ec of the second oxide layer 32. For example, each the first oxide layer 31 and the second oxide layer 32 includes a silicon oxide. On the other hand, the storage layer 50 includes a silicon nitride.

In the semiconductor memory device 110, for example, a potential (voltage) of the semiconductor layer 20 is set as a reference. For example, if a positive voltage is applied to the first electrode 41, charges (electrons) pass from semiconductor layer 20 through the first oxide layer 31 (tunnel insulating layer) to be injected into the storage layer 50 (charge storage film). Movement of the injected charges to the first electrode 41 is suppressed by the second oxide layer 32 (block insulating layer). The charges injected into the storage layer 50 are trapped by the storage layer 50 to be stored in the storage layer 50. According to the existence (amount) of the charges in the storage layer 50, a threshold value of a current flowing in the semiconductor layer 20 is changed. By this operation (for example, a write operation), a first state is formed. If a voltage having a polarity opposite to the aforementioned voltage is applied between the semiconductor layer 20 and the first electrode 41, the charges stored in the storage layer 50 move to the semiconductor layer 20. By this operation (for example, an erase operation), a second state is formed. By detecting a threshold value in the first state and the second state, a read operation for the stored state is performed.

In the embodiment, in the storage layer 50, a third region 53 is provided between the first region 51 of a silicon nitride and the second region 52 of a silicon nitride. A plurality of the first metal atoms 53M are provided in the third region 53. The plurality of the first metal atoms 53M include, for example, at least one of Ti, La, Hf, Ru, Ta, and Mo. It is found that, as described below, by providing the metal atoms in the charge storage film, the characteristic about the charge storage is improved.

In addition, in the embodiment, a density (first density) of binding of the first metal atoms 53M in the third region 53 is lower than a density (second density) of binding of the first metal atom 53M and the nitrogen atom in the third region 53. For example, in the case of using Ti (titanium) as the first metal atoms 53M, the density (first density) of Ti—Ti binding is lower than the density (second density) of Ti—N binding. For example, the first density is ¼ or less of the second density. The first density may be 1/10 or less of the second density.

Information on the density of binding of the first metal atoms 53M and the density of binding of the first metal atom 53M and the nitrogen atom in the third region 53 are obtained, for example, by XAFS (X-ray absorption fine structure) analysis.

In the third region 53, the plurality of the metal atoms 53M are substantially separated from each other.

For example, the plurality of the first metal atoms 53M are distributed along a direction along a first interface F1 between the semiconductor layer 20 and the first oxide layer. For example, the plurality of the first metal atoms 53M are distributed along a direction along a second interface F2 between the first electrode 41 and the second oxide layer 32. The plurality of the first metal atoms 53M are distributed along a direction along a third interface F3 between the first oxide layer 31 and the first region 51. For example, the plurality of the first metal atoms 53M are distributed along a direction along a fourth interface F4 between the second oxide layer 32 and the second region 52. The plurality of the metal atoms 53M are distributed, for example, along a plane perpendicular to the first direction (X-axis direction). For example, the plane is parallel to the second direction (Z-axis direction). The plurality of the metal atoms 53M are distributed in the plane perpendicular to the first direction (X-axis direction).

In the third region 53, the plurality of the metal atoms 53M do not have, for example, a cluster shape. The plurality of the metal atoms 53M do not have, for example, a nano-dot shape. If the plurality of the metal atoms 53M have a cluster shape or a nano-dot shape, the binding of the first metal atoms 53M exists. Therefore, the density (first density) of binding of the first metal atoms 53M is not less than the density (second density) of binding of the first metal atom 53M and the nitrogen atom.

It was found that, in a case where the third region 53 including the plurality of the metal atoms 53M is provided in the storage layer 50, when the density (first density) of binding of the first metal atoms 53M is high and is not less than the density (second density) of binding of the first metal atom 53M and the nitrogen atom, the characteristic about the charge storage is low. In addition, it was found that, when the density (first density) of binding of the first metal atoms 53M is lower than the density (second density) of binding of the first metal atom 53M and the nitrogen atom, the characteristic about charge storage and retention can be improved.

For example, a write/erase window is enlarged. A good data retention characteristic is obtained. For example, although a size of a memory cell is reduced, an appropriate operation is performed. For example, it is possible to provide a semiconductor memory device capable of improving the storage density. A highly-reliable store operation is obtained.

FIG. 2A to FIG. 2F are graphs illustrating characteristics of the semiconductor memory device.

Figure 2A:
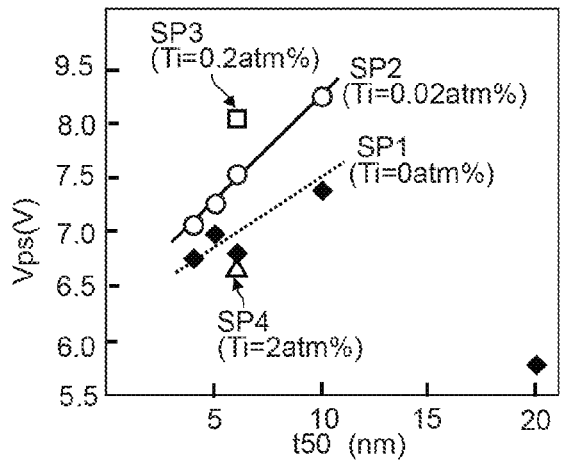
FIG. 2A to FIG. 2F are graphs illustrating characteristics of the semiconductor memory device.

FIG. 2A illustrates a characteristic about a write operation of the semiconductor memory device. A horizontal axis is a thickness t50 (nm) of the intermediate layer 50. A vertical axis is a threshold voltage Vps (V) in a write state (write saturation period). In the example, Ti is used as the metal atom 53M. The figures illustrate results for four types of samples. In a first sample SP1, Ti is not provided in the intermediate layer 50. Namely, the concentration of Ti in the first sample SP1 is 0 atm % (atomic percent). In the second to fourth samples SP2 to SP4, Ti is provided as a metal atom 53M. The concentration of Ti in the second sample SP2 is 0.02 atm %. The concentration of Ti in the third sample SP3 is 0.2 atm %. The concentration of Ti in the fourth sample SP4 is 2 atm %.

As shown in FIG. 2A, in the first sample SP1 in which Ti is not provided, the threshold voltage Vps in writing is relatively low. In contrast, in the second sample SP2 containing 0.02 atm % of Ti, the threshold voltage Vps is increased, so that the characteristic is improved. In the third sample SP3 containing 0.2 atm % of Ti, the threshold voltage Vps is further increased, so that the characteristic is further improved. In the fourth sample SP4 containing 2 atm % of Ti, the threshold voltage Vps is decreased, so that the characteristic is deteriorated. Namely, by providing an appropriate concentration of Ti in the intermediate layer 50, the characteristic in writing is improved.

In the aforementioned fourth sample SP4, the Ti—Ti binding is observed. The density of Ti—Ti binding is higher than the density of Ti—N binding. On the other hand, in the second and third samples SP2 and SP3 having a good characteristic, the density of Ti—Ti binding is lower than the density of Ti—N binding. In these samples, the density of Ti—Ti binding is ¼ or less of the density of Ti—N binding, and for example, 1/10 or less of the density of Ti—N binding.

It was found that, in this manner, by providing the Ti (metal atoms 53M) in the intermediate layer 50 (third region 53) in the state that the density of Ti—Ti binding is lower than the density of Ti—N binding, the characteristic in writing is improved.

Figure 2B:
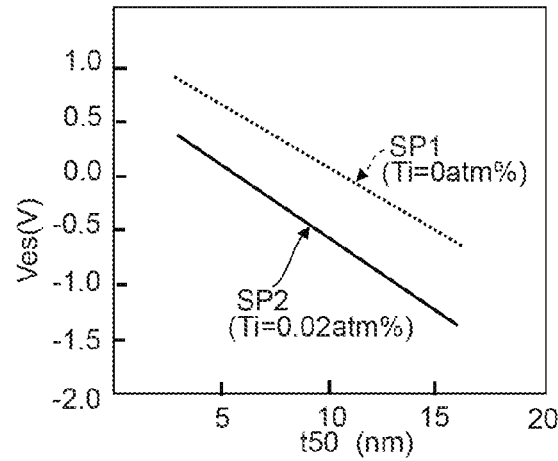

FIG. 2B illustrates a characteristic about an erase operation of the semiconductor memory device. A horizontal axis is a thickness t50 of the intermediate layer 50. A vertical axis is a threshold voltage Ves (V) in an erase state. The figure shows the characteristics of the first and second samples SP1 and SP2. As shown in FIG. 2B, in the second sample SP2 containing 0.02 atm % of Ti, the threshold voltage Vpe in erasing is lower than that of the first sample SP1 containing no Ti. In this manner, by providing a predetermined low concentration of Ti, the characteristic in erasing is also improved.

Like this, by providing a predetermined low concentration of Ti, the write/erase window is enlarged.

Figure 2C:
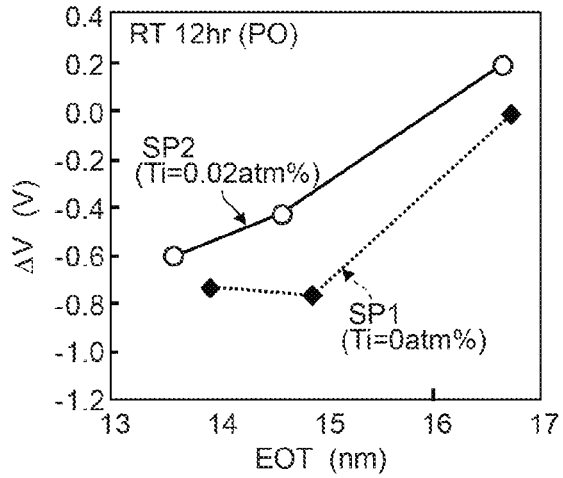
Figure 2D:
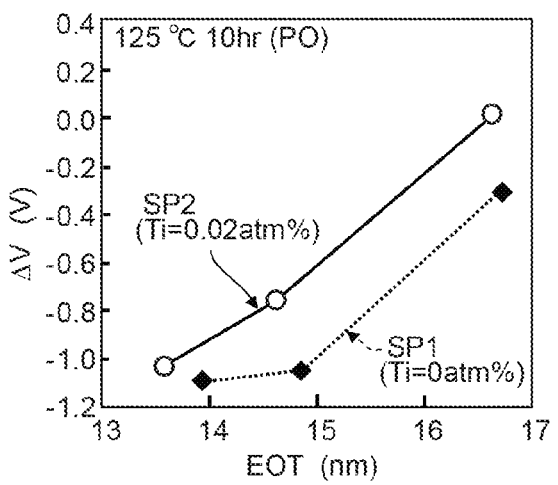

FIG. 2C and FIG. 2D illustrate retention characteristics in the write operation of the semiconductor memory device. FIG. 2C shows a change ΔV (V) in threshold voltage when 12 hours elapses at a room temperature RT (about 20° C.) after the write operation PO. FIG. 2D shows a change ΔV (V) in threshold voltage when 10 hours elapses at a temperature of 125° C. after the write operation PO. The figures show the characteristics of the first and second samples SP1 and SP2. A horizontal axis is an equivalent oxide thickness EOT of the intermediate layer 50. In the characteristics, a low absolute value of ΔV corresponds to a good characteristic.

As shown in FIG. 2C and FIG. 2D, the absolute value of the change ΔV in threshold voltage of the second sample SP2 containing 0.02 atm % of Ti is lower than that of the first sample SP1 containing no Ti. Like this, by providing a predetermined low concentration of Ti, the retention characteristic in the write operation PO is improved.

Figure 2E:
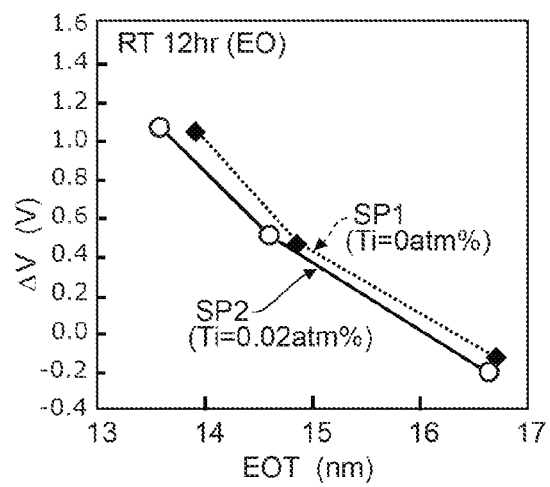
Figure 2F:
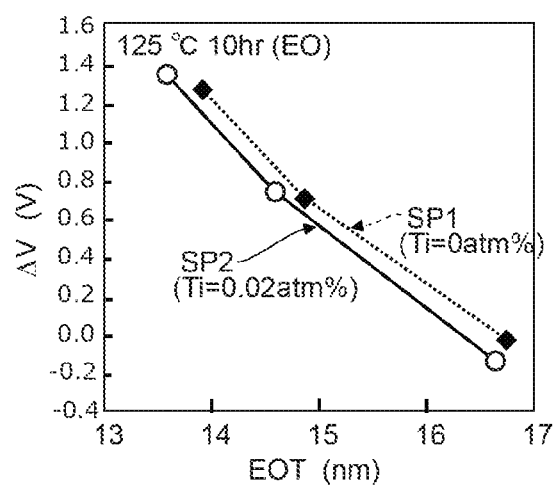

FIG. 2E and FIG. 2F illustrate retention characteristics in the erase operation of the semiconductor memory device. FIG. 2E shows a change ΔV (V) in threshold voltage when 12 hours elapses at a room temperature RT (about 20° C.) after the erase operation EO. FIG. 2F shows a change ΔV (V) in threshold voltage when 10 hours elapses at a temperature of 125° C. after the erase operation EO. The figures show the characteristics of the first and second samples SP1 and SP2. A horizontal axis is an equivalent oxide thickness EOT of the intermediate layer 50. In the characteristics, a low absolute value of ΔV corresponds to a good characteristic.

As shown in FIG. 2E and FIG. 2F, the absolute value of the change ΔV in threshold voltage of the second sample SP2 containing 0.02 atm % of Ti is lower than that of the first sample SP1 containing no Ti. Like this, by providing a predetermined low concentration of Ti, the retention characteristic in the erase operation EO is improved.

Like this, by providing the first metal atoms 53M in the third region 53 of the intermediate layer 50, a good storage characteristic is obtained. In addition, when the density (first density) of binding of the first metal atoms 53M in the third region 53 is lower than the density (second density) of binding of the first metal atom 53M and the nitrogen atom in the third region 53, a good storage characteristic is obtained. For example, when the plurality of the first metal atoms 53M are substantially separated from each other to be dispersed in the third region 53 of the storage layer 50, a good storage characteristic is obtained.

Hereinafter, for simplifying the description, a case where the third region 53 is provided along the Z-Y plane (refer to FIG. 1A) will be described. For example, there is a reference example where the first metal atoms 53M are dispersed in a cluster shape or a nano-dot shape. In the reference example, in a case where charges (for example, electrons) move along the X-axis direction, the charges are trapped, for example, at the cluster in a path overlapping the cluster in the X-axis direction. On the other hand, in a path not overlapping the cluster in the X-axis direction, the charges are not trapped at the cluster. For this reason, the charge trap performance is very different between a region overlapping the cluster (region near to the cluster) and a region being away from the cluster. Therefore, in the reference example, a charge trap characteristic is different according to a position in the Z-Y plane. For example, when the memory cell is miniaturized to have a small size in the Z-Y plane of the storage layer 50, the charge storage characteristic is different among the plurality of the storage layers 50, so that the characteristic becomes non-uniform. Therefore, in the reference example, it is difficult to reduce the size of the memory cell.

Furthermore, in the reference example, for example, a region where the retention characteristic is good and a region where the retention characteristic is bad are generated in the Z-Y plane. For example, the entire retention characteristic is greatly influenced by the region where the retention characteristic is low, and thus, the entire retention characteristic is lowered.

In addition, in the reference example, the charges (for example, electrons) can move in the cluster having a large volume. Namely, a variation in positions of the charges in the X-axis direction is large. Therefore, a variation in threshold value of the semiconductor layer 20 is large.

In contrast, in the embodiment, the plurality of the first metal atoms 53M in the third region 53 do not have a cluster shape. The plurality of the first metal atoms 53M are substantially separated from each other to be dispersed along the Z-Y plane. A variation in distribution of the plurality of the first metal atoms 53M in the third region 53 is small in comparison with the case of the cluster shape. The distribution of the plurality of the first metal atoms 53M is highly uniform. For this reason, in a case where the charges (for example, electrons) move along the X-axis direction, the charges are uniformly trapped in the Z-Y plane by the plurality of the first metal atoms 53M uniformly dispersed. Therefore, even in a case where the storage layer 50 has a small size in the Z-Y plane, the charge storage characteristic in the plurality of the storage layers 50 is highly uniform. Although the size of the memory cell is reduced, the uniform characteristic is obtained. It is possible to improve the storage density.

In addition, in the embodiment, a variation in retention characteristic in the Z-Y plane is small. A good retention characteristic is obtained. A highly-reliable store operation is obtained.

In addition, in the embodiment, a variation in position of the trapped charge along the X-axis direction is small. Therefore, a variation in threshold value of the semiconductor layer 20 is enabled to be small. For example, a multi-value store operation is facilitated.

In the embodiment, a thickness of the third region 53 where the plurality of the first metal atoms 53M are provided is small. For example, the thickness t3 of the third region 53 along the X-axis direction (first direction from the semiconductor layer 20 toward the first electrode 41) is 0.4 nm or less. The thickness t3 substantially corresponds to, for example, a diameter of the first metal atom 53M. For example, the thickness t3 of the third region 53 substantially corresponds to a thickness of a single-atom layer. Therefore, the variation in position of the trapped charge along the X-axis direction can be suppressed, and for example, as described above, the variation in threshold value is enabled to be small.

For example, in the reference example where cluster-shaped metal atoms are provided, a thickness of a region where clusters are provided is larger than, for example, that of a single-atom layer. The thickness is larger than 0.4 nm, for example, 1 nm or more.

In addition, in the third region 53 which is thin, the plurality of the first metal atoms 53M are dispersed at an appropriate surface density. Namely, such a surface density that the plurality of the first metal atoms 53M are substantially separated from each other is employed. For example, the surface density of the plurality of the first metal atoms 53M within a plane perpendicular to the X-axis direction (first direction) is, for example, $1 \times 10^{13}$ cm$^{-2}$ or less. If the surface density is higher than $1 \times 10^{13}$ cm$^{-2}$, for example, the first metal atoms 53M are easy to form a cluster shape. If the surface density is set to be, for example, $1 \times 10^{13}$ cm$^{-2}$ or less, the binding of the first metal atoms 53M can be suppressed.

In this manner, in the embodiment, the density of the plurality of the first metal atoms 53M in the third region 53 is set to be low. Therefore, the density (first density) of binding of the first metal atoms 53M in the third region 53 can be set to be lower than the density (second density) of binding of the first metal atom 53M and the nitrogen atom in the third region 53.

In this manner, the density of binding of the first metal atoms 53M is low, and the plurality of the first metal atoms 53M are substantially separated from each other to be dispersed, so that the movement of charges (for example, electrons) between the plurality of the first metal atoms 53M is suppressed. For example, the movement of charges between the energy levels is suppressed. For example, "lateral missing" can be suppressed.

In the embodiment, the surface density of the plurality of the first metal atoms 53M is, for example, $2 \times 10^{12}$ cm$^{-2}$ or more. By setting the surface density of the plurality of the first metal atoms 53M to be $2 \times 10^{12}$ cm$^{-2}$ or more, the effect of the charge trap characteristic is effectively obtained.

For example, in the reference example where cluster-shaped metal atoms are provided, a state that an average surface density of the metal atoms is in a range of approximately $1 \times 10^{13}$ cm$^{-2}$ to $1 \times 10^{15}$ cm$^{-2}$ is considered. In this case, the surface density is an average density of portions where the cluster exists and portions where the cluster does not exist. In the reference example, the thickness of the region where the cluster is provided is larger than 0.4 nm. A case where the average surface density in the reference example is the same as that of the embodiment is also distinguished from the configuration of the embodiment in terms that the thickness of the region where the cluster is provided is large.

In the embodiment, the binding of the first metal atom 53M and oxygen may exist in the third region 53. For example, in the case of using Ti (titanium) as the first metal atom 53M, the Ti—O binding may exist. If the Ti—O binding exists in the third region 53, for example, a dangling bond of Ti is terminated, and passivation can be performed. At this time, the density of Ti—Ti binding is lower than the density of Ti—O binding. For example, the first density of binding of the first metal atoms 53M is lower than the third density of the binding of the first metal atom 53M and the oxygen atom in the third region 53.

The binding of silicon and nitrogen may exist in the third region 53. As illustrated in FIG. 1A, a region where the plurality of the first metal atoms 53M are not arranged exists in the third region 53. The region is a silicon nitride region. Therefore, the binding of silicon and nitrogen is observed in the third region 53.

In the embodiment, the binding of silicon and oxygen may exist in the third region 53. A portion of the third region 53 may be, for example, an SiON. Therefore, an energy level which is deeper than that of an SiN can be formed in the third region 53. Accordingly, the retention characteristic can be further improved. For example, the surface density of the binding of silicon and oxygen in the third region 53 in the plane perpendicular to the X-axis direction (first direction) is higher than the surface density of the binding of silicon and oxygen in the first region 51 in the plane perpendicular to the X-axis direction (first direction). For example, the surface density of the binding of silicon and oxygen in the third region 53 in the plane perpendicular to the X-axis direction (first direction) is higher than the surface density of the binding of silicon and oxygen in the second region 52 in the plane perpendicular to the X-axis direction (first direction). For example, the concentration of oxygen in the third region 53 is higher than the concentration of oxygen in the first region 51 and is higher than the concentration of oxygen in the second region 52. Therefore, a higher retention characteristic is obtained.

In the embodiment, the third region 53 as described above is provided between the first region 51 and the second region 52. Due to the first region 51 and the second region 52, the movement (for example, diffusion) of the first metal atoms 53M included in the third region 53 is suppressed. The respective thicknesses of the first region 51 and the second region 52 are set to be predetermined values or more. Therefore, the movement (for example, diffusion) of the first metal atoms 53M is suppressed. For example, each of the thickness t1 (refer to FIG. 1A) of the first region 51 along the X-axis direction (first direction) and the thickness t2 (refer to FIG. 1A) of the second region 52 along the X-axis direction is, for example, is not less than a c-axis lattice constant of a β-type silicon nitride. For example, each of the thickness t1 and the thickness t2 is 0.3 nm or more. Therefore, the movement (for example, diffusion) of the first metal atoms 53M included in the third region 53 can be suppressed. At least one of the thickness t1 and the thickness t2 may be 1 nm or more and 2 nm or less.

Hereinafter, an example of a method of manufacturing the semiconductor memory device 110 according to the embodiment will be described.

FIG. 3A to FIG. 3D are schematic cross-sectional views of a sequence of process illustrating the method of manufacturing the semiconductor memory device according to the first embodiment.

Figure 3A:
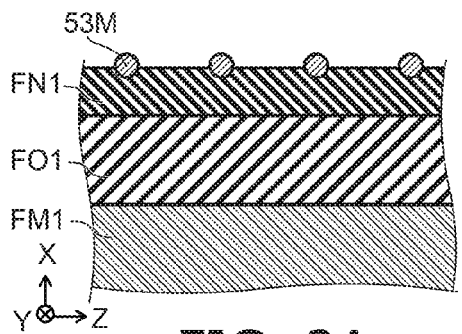
FIG. 3A to FIG. 3D are schematic cross-sectional views of a sequence of process illustrating the method of manufacturing the semiconductor memory device according to the first embodiment.

As shown in FIG. 3A, a first oxide film FO1 is provided on a first conductive film FM1, and a first nitride film FN1 is provided thereon. The plurality of the first metal atoms 53M are arranged on the first nitride film FN1. The first conductive film FM1 is, for example, a layer which becomes one of the semiconductor layer 20 and the first electrode (electrode 40). The first oxide film FO1 is, for example, a silicon oxide film (an SiO$_2$ film). The first nitride film FN1 is, for example, a silicon nitride film (an SiN film, for example, an Si$_3$N$_4$ film). The first metal atom 53M is, for example, Ti. The surface density of the first metal atoms 53M is, for example, $1 \times 10^{13}$ cm$^{-2}$ or less.

Figure 3B:
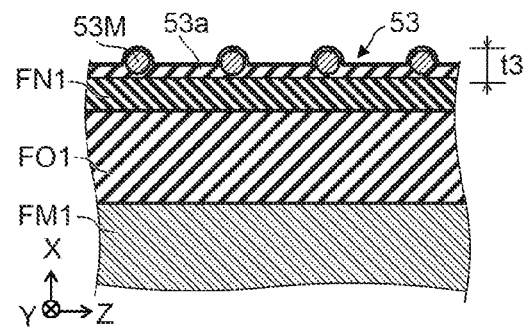

As shown in FIG. 3B, by performing a process in an ambient including at least one of nitrogen and oxygen, an oxynitride layer 53a is formed on at least a portion of a surface of the first nitride film FN1. A binding end having a low energy level is terminated. The oxynitride layer 53a is also formed on the surface of the first metal atoms 53M. For example, a region (an SiON) including Si, nitrogen, and oxygen is formed on the surface of the first nitride film FN1. In the region, an energy level which is deeper than that of an SiN is formed. A region including the first metal atom 53M, oxygen, and nitrogen (for example, a region including Ti—N binding and Ti—O binding) is formed on the surface of the first metal atoms 53M. A region including the plurality of the first metal atoms 53M and regions provided around the metal atoms becomes the third region 53. The thickness t3 of the third region 53 is about 0.4 nm or less.

Figure 3C:
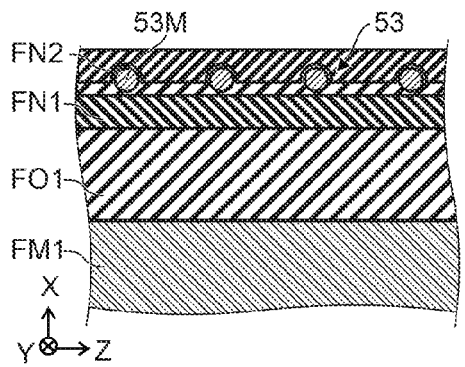

As shown in FIG. 3C, a second nitride film FN2 is formed on the third region 53. The second nitride film FN2 is, for example, a silicon nitride film (an SiN film, for example, an $Si_3N_4$ film).

Figure 3D:
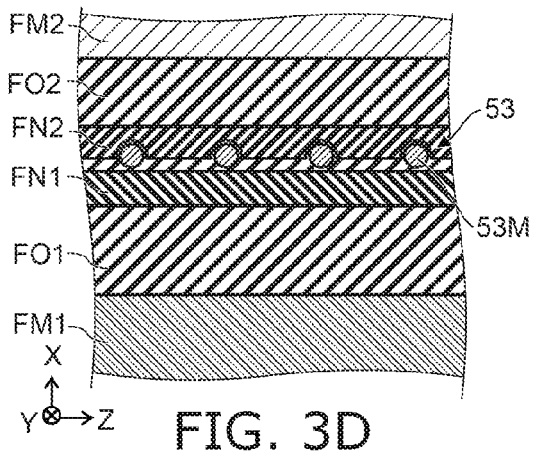

As shown in FIG. 3D, a process target including the second nitride film FN2 is processed in an ambient including at least one of nitrogen and oxygen. A binding end having a low energy level is terminated. Next, a second oxide film FO2 is formed on the second nitride film FN2, and a second conductive film FM2 is further formed thereon. The second conductive film FM2 is a layer which becomes the other one of the semiconductor layer 20 and the first electrode (electrode 40).

By the processes described above, the semiconductor memory device 110 is obtained. In the above description, the process in the ambient including at least one of nitrogen and oxygen after the formation of the second nitride film FN2 may be performed if necessary or may be omitted. Due to the above-described manufacturing method, it is possible to provide a method of manufacturing a semiconductor memory device capable of improving the storage density.

Second Embodiment

Figure 4A:
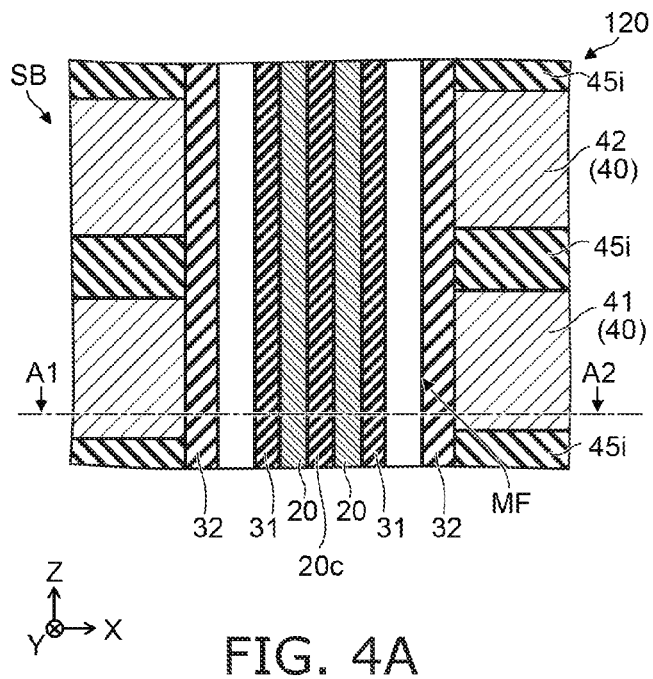
FIG. 4A and FIG. 4B are schematic cross-sectional views illustrating a semiconductor memory device according to a second embodiment.
Figure 4B:
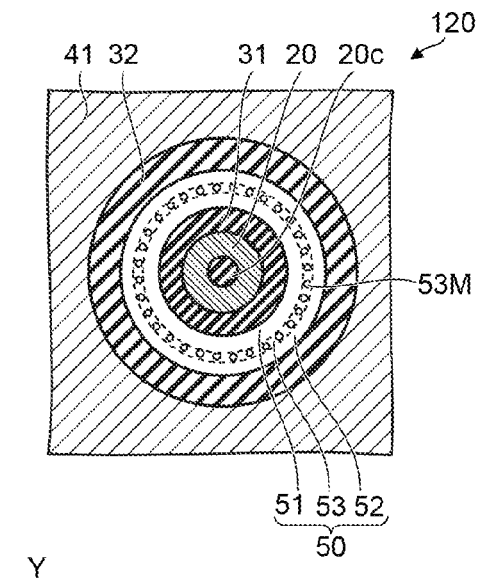

FIG. 4A and FIG. 4B are schematic cross-sectional views illustrating a semiconductor memory device according to a second embodiment. FIG. 4B is a cross-sectional view taken along line A1-A2 of FIG. 4A.

As shown in FIG. 4A, the semiconductor memory device 120 according to the embodiment is also configured to include a semiconductor layer 20, a first electrode 41, a first oxide layer 31, a second oxide layer 32, and a storage layer 50. The semiconductor memory device 120 is configured to further include a second electrode 42 and an insulating layer 45i. In the semiconductor memory device 120, the semiconductor layer 20, the first electrode 41, the first oxide layer 31, the second oxide layer 32, and the storage layer 50 are the same as those of the semiconductor memory device 110. Hereinafter, the second electrode 42 and the insulating layer 45i will be described.

The second electrode 42 is arranged with the first electrode 41 in the second direction intersecting the first direction (X-axis direction). In other words, the first direction (X-axis direction) is an arbitrary direction intersecting the second direction (Z-axis direction). In the example, the second direction is the Z-axis direction. The insulating layer 45i is provided between the first electrode 41 and the second electrode 42. Namely, a stacked member SB is provided in the semiconductor memory device 120. The stacked member SB includes a plurality of electrodes 40 arranged along the Z-axis direction (second direction). The insulating layer 45i is arranged between the electrodes 40.

The semiconductor layer 20 extends in the stacked member SB including the first electrode 41, the insulating layer 45i, and the second electrode 42 along the Z-axis direction (second direction).

As shown in FIG. 4B, the first oxide layer 31, the second oxide layer 32, and the storage layer 50 have a tubular shape. The first oxide layer 31 is provided between the semiconductor layer 20 and the first electrode 41, the second oxide layer 32 is provided between the first oxide layer 31 and the first electrode 41, and the storage layer 50 is provided between the first oxide layer 31 and the second oxide layer 32. In addition, as shown in FIG. 4A, the first oxide layer 31 is further provided between the second electrode 42 and the semiconductor layer 20. The second oxide layer 32 is further provided between the second electrode 42 and the first oxide layer 31. In one direction intersecting the Z-axis direction, in an area between the semiconductor layer 20 and the second electrode 42, the storage layer 50 is further provided between the first oxide layer 31 and the second oxide layer 32. The storage layer 50 is also further provided between the second electrode 42 and the semiconductor layer 20.

In the example, a core pillar 20c is provided. The core pillar 20c extends in the stacked member SB in the Z-axis direction. The core pillar 20c has, for example, an insulating property.

In the semiconductor memory device 120, similarly, the density (first density) of binding of the first metal atoms 53M in the third region 53 is lower than the density (second density) of binding of the first metal atom 53M and the nitrogen atom in the third region 53. In the example, the plurality of the metal atoms 53M are distributed, for example, along a plane perpendicular to the first direction (X-axis direction). The plane is a tubular plane aligned along the Z-axis direction. In the semiconductor memory device 120, similarly, for example, it is possible to improve the storage density.

Figure 5:
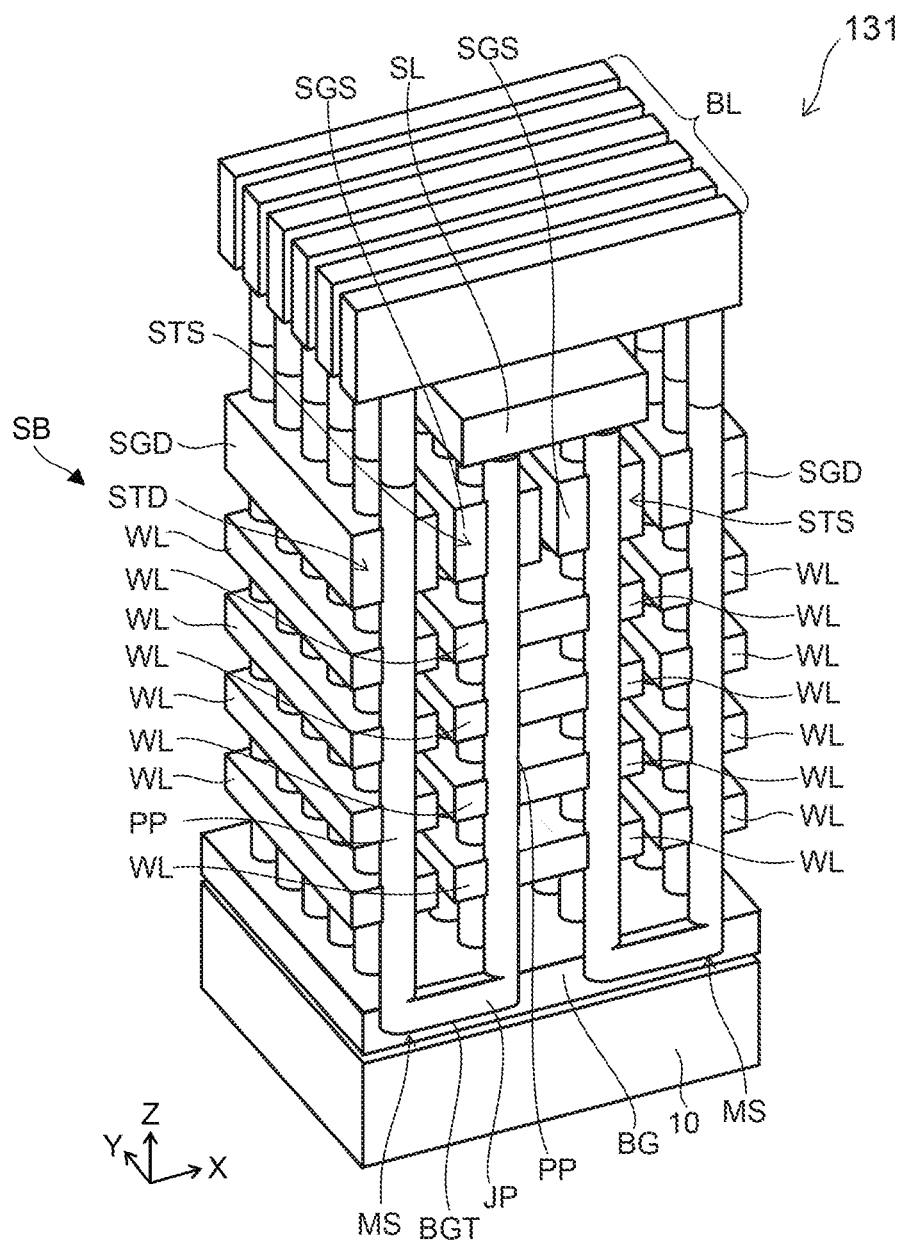
FIG. 5 is a schematic perspective view illustrating the semiconductor memory device according to the second embodiment.

FIG. 5 is a schematic perspective view illustrating the semiconductor memory device according to the second embodiment. In FIG. 5, for the better understanding of the figure, at least a portion of insulating portions is omitted.

As shown in FIG. 5, memory cells are three-dimensionally arranged in the semiconductor memory device 120.

In the semiconductor memory device 120, a back gate BG is provided on a base substrate 10. The stacked member SB is provided thereon. The stacked member SB includes a plurality of conductive layers WL and a plurality of insulating layers (not shown and, for example, corresponding to the insulating layers 45i) which are alternately provided. A stacking direction of the stacked member SB corresponds to the Z-axis direction.

The base substrate 10 is, for example, a semiconductor substrate (silicon substrate or the like). The back gate BG includes, for example, a silicon containing impurities. The conductive layer WL includes, for example, a metal (for example, tungsten or the like) or a semiconductor (for example, a silicon containing impurities or the like). The conductive layer WL becomes, for example, a word line.

A plurality of memory strings MS are provided to the semiconductor memory device 120. One memory string MS includes a pillar portion PP. In the example, one memory string MS includes two pillar portions PP and a joint portion JP. The joint portion JP joints lower ends of the two pillar portions PP. The memory string MS has, for example, a U shape.

The pillar portion PP has, for example, a pillar shape (a cylindrical shape, a flat cylindrical shape, or the like). The pillar portion PP extends in the stacked member SB in the Z-axis direction. A drain-side select gate SGD is provided to an upper end of one of the pillar portions PP. A source-side select gate SGS is provided to an upper end of another of the pillar portions PP. The drain-side select gate SGD and the source-side select gate SGS become, for example, an upper select gate. The drain-side select gate SGD and the source-side select gate SGS are provided, for example, through an insulating layer on the uppermost conductive layer WL. Each of the drain-side select gate SGD and the source-side select gate SGS includes, for example, a silicon containing impurities. An isolation insulating layer (not shown) is provided between the drain-side select gate SGD and the source-side select gate SGS. These gates extend along the Y-axis direction.

The stacked member SB under the drain-side select gate SGD and the stacked member SB under the source-side select gate SGS are isolated from each other by an isolation insulating layer. The stacked bodies SB extend in the Y-axis direction.

A source line SL (for example, a metal film) is provided on the source-side select gate SGS through an insulating layer. A plurality of bit lines BL (for example, metal films) are provided on the drain-side select gate SGD and on the source line SL through insulating layers. Each of the plurality of the bit lines BL extends in the X-axis direction.

The plurality of the conductive layers WL correspond to the plurality of the electrodes 40. Each of the plurality of the conductive layers WL corresponds to each of the plurality of the memory cells.

A drain-side select transistor STD is provided to an upper end of one of the pillar portions PP. A source-side select transistor STS is provided to an upper end of another of the pillar portions PP. The memory cell, the drain-side select transistor STD, and the source-side select transistor STS are vertical-type transistors. In such a transistor, a current is flowed along the Z-axis direction.

The drain-side select gate SGD functions as a gate electrode (control gate) of the drain-side select transistor STD. An insulating layer (not shown) is provided between the drain-side select gate SGD and the semiconductor layer 20. The insulating layer functions as a gate insulating layer of the drain-side select transistor STD. A channel body (semiconductor layer 20) of the drain-side select transistor STD is connected to the bit lines BL above the drain-side select gate SGD.

The source-side select gate SGS functions as a gate electrode (control gate) of the source-side select transistor STS. An insulating layer (not shown) is provided between the source-side select gate SGS and the semiconductor layer 20. The insulating layer functions as a gate insulating layer of the source-side select transistor STS. A channel body (semiconductor layer 20) of the source-side select transistor STS is connected to the source line SL above the source-side select gate SGS.

A back gate transistor BGT is provided in the joint portion JP of the memory string MS. The back gate BG functions as a gate electrode (control gate) of the back gate transistor BGT.

A memory film MF (stacked film including at least a portion of the first oxide layer 31, the second oxide layer 32, and the storage layer 50) which is provided in the pillar portion PP may also be provided in the back gate BG. The memory film MF functions as a gate insulating layer of the back gate transistor BGT.

A plurality of the memory cells are provided between the drain-side select transistor STD and the back gate transistor BGT. A plurality of the memory cells are also provided between the back gate transistor BGT and the source-side select transistor STS. Each of the plurality of the memory cells uses each of the plurality of the conductive layers WL as a control gate.

A plurality of the memory cells, the drain-side select transistor STD, the back gate transistor BGT, and the source-side select transistor STS are connected in series through the semiconductor layer 20. Therefore, one U-shaped memory string MS is formed. A plurality of the memory strings MS are arranged in the X-axis direction and the Y-axis direction. A plurality of the memory cells are three-dimensionally provided in the X-axis direction, the Y-axis direction, and the Z-axis direction.

In the embodiment, the two pillar portions PP may not be jointed. The lower end of one pillar portion PP may be connected to, for example, the source line SL, and the upper end thereof may be connected to, for example, the bit line BL.

According to the embodiment, it is possible to provide a semiconductor memory device capable of improving a storage density.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor memory devices such as semiconductor layers, electrodes, oxide layers, storage layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor memory devices practicable by an appropriate design modification by one skilled in the art based on the semiconductor memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
   a semiconductor layer;
   a first electrode;

a first oxide layer provided between the semiconductor layer and the first electrode;

a second oxide layer provided between the first oxide layer and the first electrode; and a storage layer provided between the first oxide layer and the second oxide layer, the storage layer including:

a first region including silicon nitride;

a second region provided between the first region and the second oxide layer and including silicon nitride; and a third region provided between the first region and the second region and including a plurality of first metal atoms, a first density of bond of the first metal atoms in the third region being lower than a second density of bond of the first metal atom and a nitrogen atom in the third region.

2. The device according to claim 1, wherein the first density is ¼ or less than the second density.

3. The device according to claim 1, wherein the first metal atoms include at least one of Ti, La, Hf, Ru, Ta, or Mo.

4. The device according to claim 1, wherein a surface density of the first metal atoms in a plane perpendicular to a first direction from the semiconductor layer toward the first electrode is $1\times10^{13}$ cm$^{-2}$ or less.

5. The device according to claim 1, wherein the first density is lower than a third density of bond of the first metal atom and an oxygen atom in the third region.

6. The device according to claim 1, wherein a concentration of oxygen in the third region is higher than a concentration of oxygen in the first region and is higher than a concentration of oxygen in the second region.

7. The device according to claim 1, further comprising:

a second electrode; a first direction from the semiconductor layer toward the first electrode crossing a second direction from the first electrode toward the second electrode; and an insulating layer provided between the first electrode and the second electrode, the first oxide layer being further provided between the second electrode and the semiconductor layer, the second oxide layer being further provided between the second electrode and the first oxide layer, and the storage layer being further provided between the second electrode and the semiconductor layer.

8. The device according to claim 7, wherein the semiconductor layer extends in a stacked member including the first electrode, the insulating layer, and the second electrode along the second direction.

9. The device according to claim 1, wherein the first metal atoms are distributed along a direction along a first interface between the semiconductor layer and the first oxide layer.

10. The device according to claim 1, wherein a thickness of the third region along a first direction from the semiconductor layer toward the first electrode is 0.4 nanometers or less.

11. The device according to claim 7, wherein a surface density of the first metal atoms in a plane perpendicular to the first direction is $1\times10^{13}$ cm$^{-2}$ or less.

12. The device according to claim 1, wherein energy of a conduction band end of the second oxide layer is higher than energy of a conduction band end of the semiconductor layer.

13. The device according to a claim 1, wherein at least one of the first oxide layer or the second oxide layer includes a silicon oxide.

14. The device according to claim 1, wherein the first oxide layer is a tunnel insulating layer, and the second oxide layer is a block insulating layer.

15. The device according to claim 1, wherein the first metal atoms are distributed along a direction along a second interface between the first electrode and the second oxide layer.

16. The device according to claim 1, wherein the first metal atoms are distributed along a direction along a third interface between the first oxide layer and the first region.

17. The device according to claim 1, wherein the first metal atoms are distributed along a direction along a fourth interface between the second oxide layer and the second region.

* * * * *